United States Patent [19]

Magoon

[11] Patent Number: 4,806,934
[45] Date of Patent: Feb. 21, 1989

[54] TRACKING CIRCUIT FOR FOLLOWING OBJECTS THROUGH ANTENNA NULLS

[75] Inventor: John E. Magoon, Maynard, Mass.

[73] Assignee: Ray Theon Company Lexington, Mass.

[21] Appl. No.: 40,399

[22] Filed: Apr. 20, 1987

[51] Int. Cl.⁴ .................. G01S 13/68; H03L 7/10; H03D 3/18
[52] U.S. Cl. .................... 342/103; 342/77; 342/442; 331/17; 331/25; 375/82; 329/105; 329/123; 328/155; 307/513
[58] Field of Search ............... 342/74, 75, 420, 422, 342/77, 81, 103, 359, 428, 442, 427, 426; 331/10, 11, 12, 17, 25, DIG. 2; 375/83, 87, 81, 82, 94; 328/133, 155; 307/262, 511, 513, 514, 515; 329/105, 123, 124, 125

[56] References Cited

U.S. PATENT DOCUMENTS

| | | | |
|---|---|---|---|
| 3,109,143 | 10/1963 | Gluth | 375/81 |
| 3,444,556 | 5/1969 | Bellinger et al. | 342/103 |
| 3,600,700 | 8/1971 | Matsuo | 331/12 |
| 3,716,802 | 2/1973 | Muratani et al. | 331/12 X |
| 3,727,227 | 4/1973 | Takao et al. | 342/81 X |
| 3,728,730 | 4/1973 | Takao et al. | 342/442 |
| 3,772,695 | 11/1973 | Hoffman | 342/77 |
| 3,787,775 | 1/1974 | Lanning | 329/122 |
| 3,859,658 | 1/1975 | Rabow | 342/78 |
| 3,883,806 | 5/1975 | DeLong et al. | 375/81 |
| 3,906,376 | 9/1975 | Bass | 331/11 X |
| 3,956,748 | 5/1976 | Rymes | 342/94 |
| 3,961,172 | 6/1976 | Hutcheon | 364/819 |
| 4,010,467 | 3/1977 | Slivka | 342/77 |
| 4,029,900 | 6/1977 | Addeo | 375/114 |
| 4,135,191 | 1/1979 | Sawicki | 342/436 |
| 4,217,551 | 8/1980 | Entenman | 375/81 |
| 4,257,007 | 3/1981 | Brooks et al. | 328/167 |
| 4,346,477 | 8/1982 | Gordy | 455/257 |
| 4,394,626 | 7/1983 | Kurihara et al. | 331/12 |

Primary Examiner—Theodore M. Blum
Assistant Examiner—Gilberto Barrón, Jr.

[57] ABSTRACT

A circuit for removing abrupt phase changes in a received signal, such as those caused when an object tracking system's directional receiving antenna becomes misaligned with the tracked object. The circuit uses a phase detector to determine when an abrupt phase change has occurred, such as when a signal returned from the tracked object aligns with an antenna null and reverses the phase of a control signal fed to a phase locked oscillator. A delaying low pass filter insures the control signal is stable before it is fed to the phase locked oscillator.

7 Claims, 4 Drawing Sheets

TRACKING CIRCUIT FOR FOLLOWING OBJECTS THROUGH ANTENNA NULLS

BACKGROUND OF THE INVENTION

The present invention relates to tracking circuits, and more particularly to a circuit capable of tracking a signal returned from a moving object as the signal passes through antenna nulls.

It is well known that radar and other electronic direction finding systems make use of the physical property that a transmitted radio frequency signal is reflected by surrounding objects. One important application for such systems is object tracking. An object tracking system's primary purposes are to determine the position and speed of a moving object by monitoring the reflected radio frequency signal as received by an antenna. The object's position is determined by using a directional receiving antenna. Such directional antennas are characterized by an antenna pattern consisting of a narrow or highly focused main lobe and attendant sidelobes. The main lobe is steered towards the moving object by feeding the antenna's electrical output to a control circuit. The control circuit controls a motor arranged for rotating the antenna. When the electrical output is at a maximum, the antenna is known to be pointing at the moving object. If the electrical output's amplitude decreases, the control circuit uses a resulting phase change in the electrical output to activate the motor so the antenna will be realigned. The object's speed is determined by using the physical property that a reflected radio frequency signal returned from a moving object exhibits frequency shift. This frequency shift, or Doppler frequency, can be detected in the electrical output to determine the object's speed.

A problem occurs with Doppler frequency tracking systems when the object moves too quickly for the antenna to be realigned, thus allowing the reflected radio frequency signal to be received through a sidelobe rather than through the main lobe. This causes an abrupt change in the antenna's electrical output as the reflected signal moves through the antenna nulls. One way of solving this problem is to use a signal processing circuit to filter abrupt changes in the electrical output. Thus, the rotation direction and Doppler frequency as determined before the abrupt amplitude or phase change occurred is used until the antenna is again aligned with the moving object. Although this technique works well, for some applications there is a period of time when the moving object is not being directly tracked. Also, Doppler frequency information may be lost by the filtering process.

Another solution to the object tracking problem is to use multiple antenna elements arranged as a phased array and beamforming techniques on outputs of the phased array to develop a plurality of steerable antenna lobes in a plurality of directions. Such systems work well for their intended purpose, but tend to be more expensive than single antenna systems.

A somewhat analogous problem is that of recovering data in a phase modulated communication signal. As is well known, a phase modulated communication signal is one where the phase of a carrier signal is modulated in accordance with data to be transmitted. In one such technique, known as biphase modulation, the communication signal consists of a carrier signal at a particular frequency transmitted with a particular phase, for example 0°, to indicate a logic 0 data bit, and with another phase, for example 180°, to indicate a logic 1 data bit. The receiver then reconstructs the data by demodulating the phase shifts in the communication signal. This demodulation problem is analogous to the object tracking problem in that they both process signals containing abrupt phase shifts. An example of one such system is shown in the United States patent granted to DeLong et al., U.S. Pat. No. 3,883,806, issued May 13, 1975 and assigned to Rockwell International Corporation of Dallas, Texas. This circuit provides a local reference signal remaining phase-continuous despite phase modulations in an input signal. The circuit operates by reversing the output of a phase lock loop each time the input signal reverses phase. However, such a circuit is not directly applicable to the present problem since the purpose of such a circuit is to detect and remove such abrupt phase transitions, whereas in the present invention it is important not only to detect and remove transistions, but also to provide a continuous and smooth indication of the instantaneous phase of the reflected signal for tracking purposes.

SUMMARY OF THE INVENTION

It is therefore an object of this invention to provide a circuit capable of continuously maintaining phase lock with a signal reflected from an object moving with a high velocity with respect to a receiving antenna.

A further object is to provide such a circuit without the need for multiple antenna elements or beamforming or other associated circuits commonly necessary for operating an array of antenna elements.

Yet another object is to provide an apparatus for outputting a Doppler frequency tracking signal without the abrupt phase reversals caused by the object passing through antenna nulls.

A still further object is to provide an apparatus capable of maintaining Doppler frequency tracking of an object even when its receiving antenna is not properly aligned with the object.

Briefly, these and other objects of this invention are accomplished by a phase lock loop circuit arranged to output an object tracking signal having a continuous phase despite discontinuous phase reversals in an input signal. The circuit combines a phase detector, for indicating if an abrupt phase change in an input signal has occurred, such as when a signal returned from a moving object has passed through an antenna null; a phase reversing circuit, controlled by the phase detector, for operating on the input signal to reverse its phase when the detector indicates that an abrupt change has occurred; and various components of a phase lock loop. In particular, the low pass filter component of the phase lock loop has a time delay greater than the time delay associated with the phase detector, so that the output of the phase detector is stable and readily available before the output of the low pass filter is fed to control the other phase lock loop components.

In accordance with one particular embodiment of the invention, the phase detector is a conventional mixer fed by a signal in phase quadrature with the phase lock loop input signal, a low pass filter with small time delay, and a Schmitt trigger arranged to provide a digital control signal for indicating when the phase lock loop input signal has gone through an abrupt phase reversal.

BRIEF DESCRIPTION OF THE DRAWINGS

These and other objects, advantages and novel features of this invention become apparent from the following detailed description when considered together with the accompanying drawings, where.

DETAILED DESCRIPTION OF THE PREFERRED EMBODIMENTS

Figure 1A:
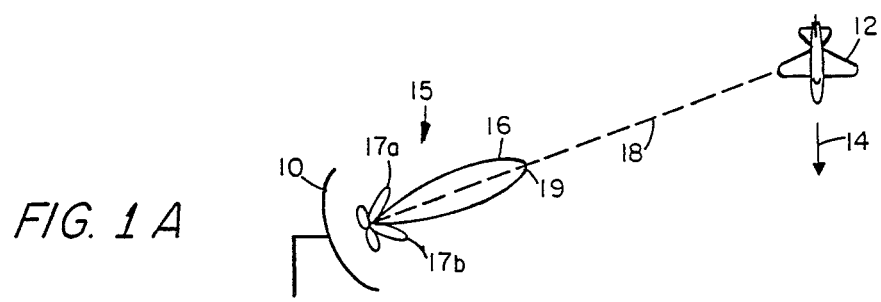
FIGS. 1A through 1E depict a series of events occurring as a moving object passes a directional antenna at a speed much faster than rotational speed of motors associated with such an antenna.
Figure 1B:
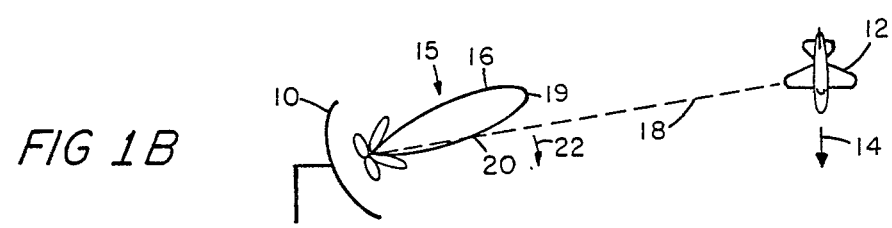
Figure 1C:
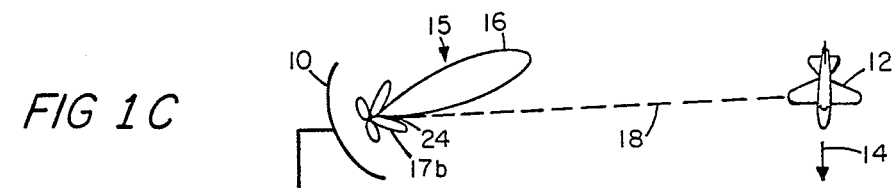

Referring now to the drawings, where like reference characters designate corresponding parts throughout the several figures, there is shown in FIG. 1A a representation (not to scale) of a radio antenna 10, its associated directional antenna pattern 15, and an airborne moving object 12 such as an airplane. The moving object 12 in this case is travelling in the direction of arrow 14. The antenna pattern 15 is seen to include a main lobe 16 and one or more sidelobes such as those indicated by reference numerals 17a and 17b. The antenna 10 is normally positioned so that the highly focused main lobe 16 aims at the moving object 12. Thus, if a bearing line 18 is drawn from the antenna 10 towards moving object 12, the bearing line 18 passes through a point near the center or boresight 19 of main lobe 16. This boresight 19 is the point at which a signal reflected by the moving object 12 is received by antenna 10. As shown in FIG. 1B, moving object 12 eventually changes its position thus causing bearing line 18 to pass through a point 20 to one side or the other of boresight 19 of main lobe 16. In such an instance, circuits associated with the electrical signal output of antenna 10 (not shown in FIG. 1) detect this offset of main lobe 16 as a reduction in amplitude and change in phase of the electrical signal output from antenna 10. Such signal processing circuits, well known in the art, make use of this amplitude reduction and phase shift of the electrical signal output to develop a control signal. This control signal in turn is fed to a motor (not shown) associated with antenna 10 to cause antenna 10 to rotate in the direction of arrow 22. In this manner the boresight 19 of main lobe 16 becomes realigned with the bearing line 18. The bearing of moving object 12 is thus determined to be the same as the particular direction in which the boresight 19 of antenna 10 is pointing.

Figure 1D:
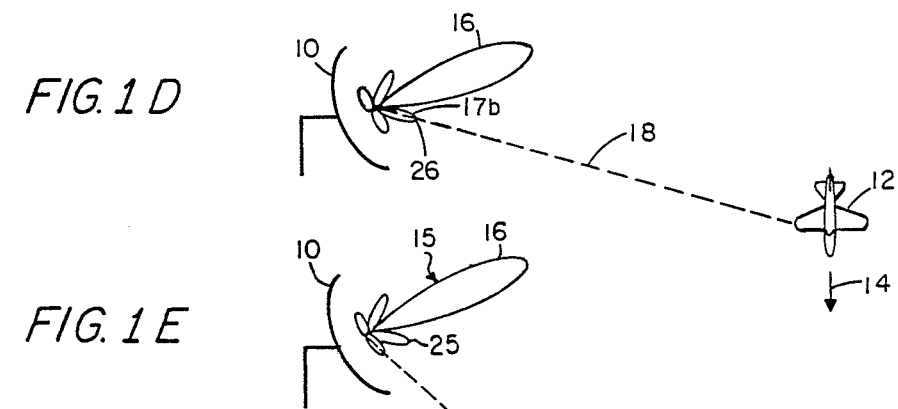
Figure 1E:
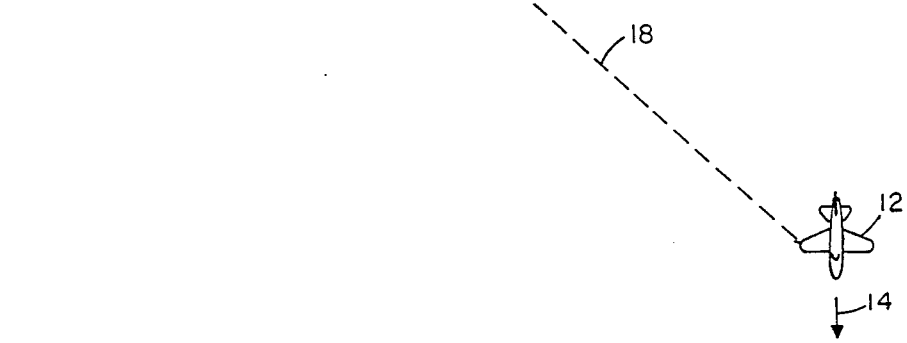

A problem occurs when moving object 12 has a very high velocity with respect to the maximum rotating speed of antenna 10. Such a situation, depicted in FIG. 1C, may occur when the moving object 12 is moving with high speed or, perhaps more commonly, when moving object 12 is passing very close to antenna 10. Although antenna 10 has begun to swing in the direction of arrow 22 to become realigned with bearing line 18, the reflected signal is now being received in a portion of antenna pattern 15 known as a null 24. This has occurred because, although antenna 10 has begun to rotate in the direction of arrow 22, moving object 12 is moving too fast for antenna 10 to remain aligned with it. The situation may continue to a point, as shown in FIG. 1D, where the reflected signal is received by antenna 10 through a point 26 on a portion of a side lobe 17b of antenna pattern 15. This is a problem because the electrical signal output from antenna 10 is now reduced in amplitude and has undergone a 180° phase reversal. The electrical signal may undergo additional phase reversals, such as in the situations shown in FIG. 1E, if another null 25 is passed. In this situation, the direct use of the electrical signal output to develop a motor control signal for antenna 10 leads to erroneous movement commands.

Figure 2:
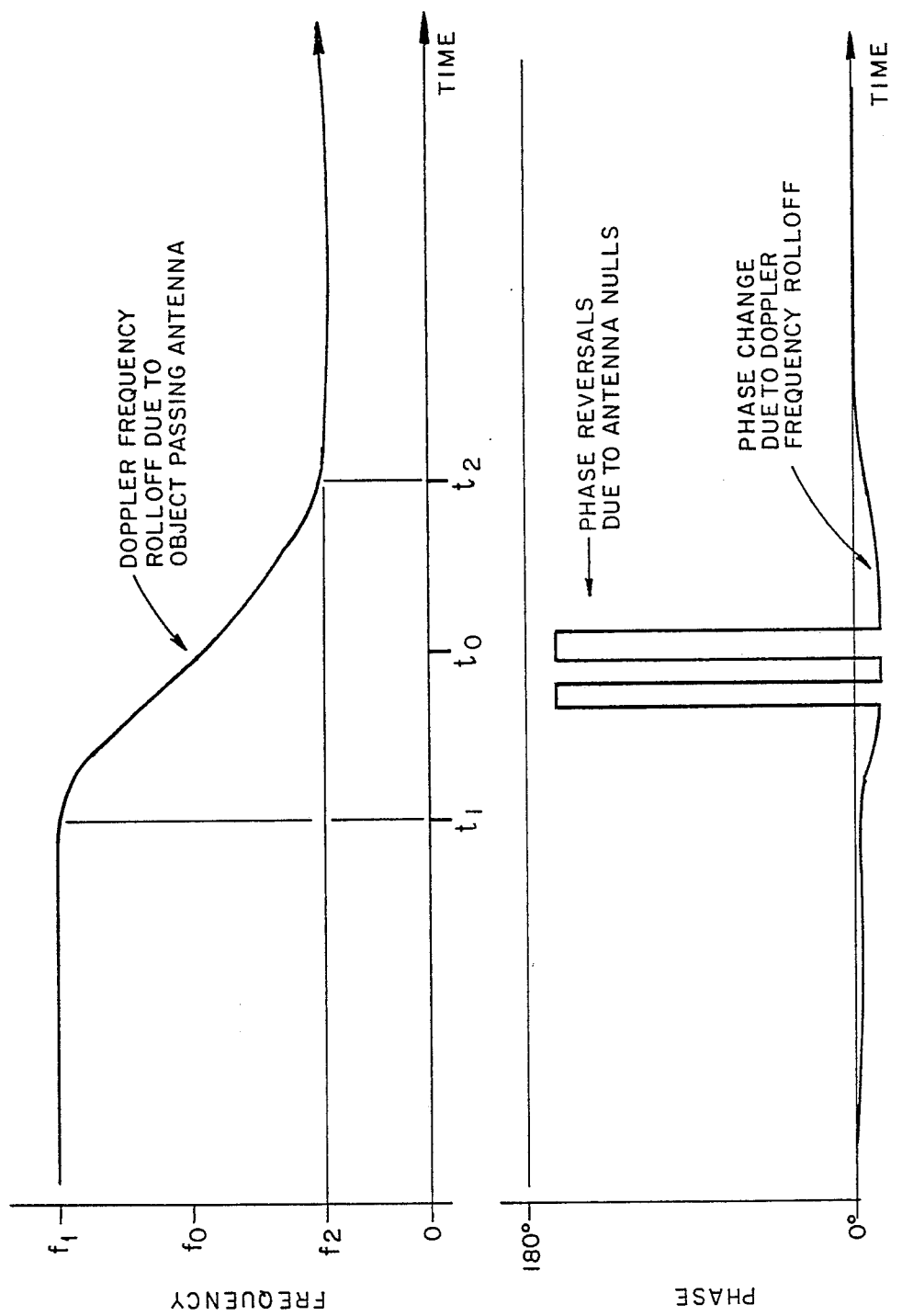
FIG. 2 is a plot of the frequency and phase of a signal reflected from the moving object as it passes the antenna.

A plot of this effect on the electrical signal output from antenna 10 is shown in FIG. 2. The upper graph is frequency versus time. This is a typical Doppler curve, with frequency, $f_1$, above a center frequency, $f_0$, before a time $t_1$. During this period, moving object 12 is approaching the antenna 10, so the electrical signal indicates a positive Doppler frequency, $f_1 - f_0$. Between times t1 and t2, moving object 12 passes and begins to recede from antenna 10, and the frequency of the electrical signal begins to roll off to $f_2$, below $f_0$. This causes the electrical signal to indicate a negative Doppler, $f_2 - f_0$.

The lower graph in FIG. 2 shows the phase of the electrical signal versus time. It illustrates the problem, occurring between times $t_1$ and $t_2$, when the antenna 10 does not remain aligned with the moving object 12. One or more 180° phase reversals occur as the moving object 12 aligns with one or more antenna nulls.

What is needed then is a circuit for recognizing that these phase changes have occurred. The circuit would then obtain the true phase change due only to Doppler frequency rolloff. The true phase change can then be used to track the moving object 12 even while the antenna 10 is misaligned.

Figure 3:
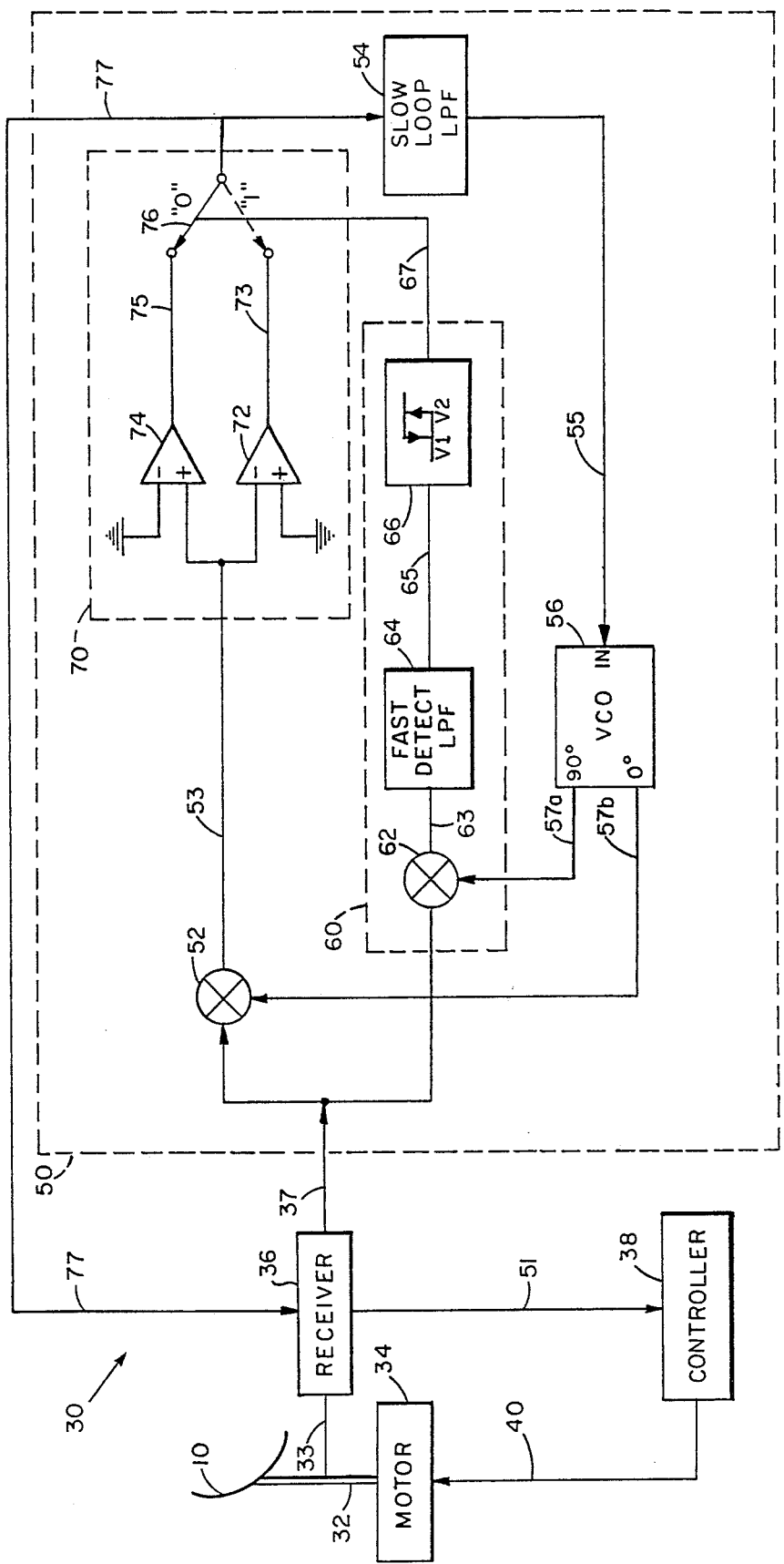
FIG. 3 shows tracking control circuits associated with such an antenna and in particular a tracking signal phase lock loop in accordance with this invention.

FIG. 3 shows a block diagram of an object tracking system, generally indicated as 30, for solving this problem. Object tracking system 30 includes a radio antenna 10, rotatably mounted upon a mast 32, and with its direction controlled by a motor 34. Antenna 10 outputs an electrical return signal 33 to a receiver 36. The receiver 36 demodulates the return signal 33 and provides an output 37 to a phase tracking circuit 50. The phase tracking circuit 50 provides a voltage at an output 77 corresponding to the relative phase of a signal reflected from a moving object 12 (FIG. 1). The output 77 of phase tracking circuit 50 is returned to receiver 36. Receiver 36 then uses the tracking circuit output 77 and the return signal 33 to track the position and speed of moving object 12. Receiver 36 may also provide such tracking information to a display or utlization device (not shown). Receiver 36 forwards this tracking information on an output signal 51 to a controller 38. Controller 38 develops a control voltage, or other electrical control signal 40, to cause motor 34 to rotate antenna 10 to allign its boresight 19 (FIG. 1) with moving object 12. Controller 38 is comprised of signal processing circuits, well known in the art, for making use of the phase information provided by output signal 51 and amplitude information present in receiver output 37 to develop the control signal 40.

Now more particularly, phase tracking circuit 50 in accordance with the present invention is seen to comprise components of a conventional phase lock loop and additional components. The phase lock loop includes a loop mixer 52, loop low pass filter 54 (also referred to as a slow low pass filter) and a voltage controlled oscillator (VCO) 56. The receiver output 37 is fed to loop mixer 52 together with the 0° output 57b of VCO 56. Thus, loop mixer 52 acts as a phase difference detector providing a signal 53 indicating the difference in phase between the receiver output 37 and the VCO 0° output signal 57b. In turn, this signal 53 is fed back to the input terminal of VCO 56 through loop low pass filter 54 to maintain the VCO 0° output signal 57b in phase lock with receiver output 37.

A phase tracking circuit 50 in accordance with the present invention also includes a phase reversal detector 60 and a phase reversing circuit 70. Phase reversal detector 60 comprises detector mixer 62, detector low pass filter 64 (also referred to as the fast low pass filter), and Schmitt trigger 66. Detector mixer 62 is fed both the receiver output 37 as well as a 90° VCO output signal 57a. While this signal 57a is shown to be fed from a 90° output terminal of VCO 56, it should be understood that such a signal 57a might also be developed at the output of a 90° phase shifter attached to the 0° output of VCO 56. The output of detector mixer 62 is in turn fed to detector low pass filter 64 through Schmitt trigger 66 to provide a phase reversal control signal 67. It is the purpose of phase reversal detector 60 to provide such a phase reversal control signal 67 when the return signal 33 has experienced an instantaneous phase shift of approximately 180°. It is seen that the detector mixer 62 provides such a control signal 67 indicative of an abrupt phase change by using a detector low pass filter 64 and a Schmitt trigger 66. Schmitt trigger 66 has a lower threshold voltage V1 and upper threshold voltage V2. The control signal 67 is a digital signal where level transitions indicate phase reversals in the receiver output 37. Preferably, it has a level change in the positive going direction (that is from a logic 0 level to a logic 1 level) when the phase of return signal 36 has abruptly changed from 0° to 180°, and has a level change in the negative direction (from logic 1 to logic 0) when the return signal 36 undergoes an abrupt negative phase change from 180° to 0°.

Phase reverser 70 is essentially a pair of amplifying circuits, including inverting amplifier 72 and non-inverting amplifier 74, and also a switch 76. The inputs of both inverting amplifier 72 and non-inverting amplifier 74 are fed by the loop phase difference signal 53 from loop detector 52. The outputs of amplifiers 72 and 74 are each fed to a corresponding input terminal of switch 76. Switch 76 is operated to select either the inverted loop phase difference signal 73 or the non-inverted loop phase difference signal 75, in accordance with the level of phase reversal control signal 67.

Having described the various components of phase tracking circuit 50 its operation can now be understood. In particular, as previously mentioned, phase tracking circuit 50 is primarily operated as a phase lock loop with the loop mixer 52 serving to provide a loop phase difference signal 53 indicating the difference between the phase of the 0° output 57b of the VCO 56 and the phase of the receiver output 37. The loop phase difference signal 53 is then fed through non-inverting amplifier 74 via switch 76 to loop low pass filter 54 and then to the control input of VCO 56. A slight variation in the phase of receiver output 37 results in a change in the voltage of loop difference signal 53. This voltage change is in turn fed through loop filter 54 to adjust the VCO 56. VCO 56 continues adjusting in this manner until such time as its 0° output 57b becomes phase aligned with the phase lock loop input, namely receiver output 37.

An important function of phase tracking circuit 50 is provided by phase reversal detector 60 and phase reverser 70. In particular, phase reversal detector mixer 62 compares the receiver output 37 with 90° phase shifted VCO output signal 57a and provides a phase reversal difference signal 63 indicating their difference. This signal 63 drives detector low pass filter 64 and Schmitt trigger 66. The output of Schmitt trigger 66, namely phase reversal control signal 67, is fed to switch 76 and serves to select one of the inverted loop mixer control signal 73 and non-inverted loop mixer control signal 75 as a selected loop control signal 51 to be fed to loop low pass filter 54. In the event that detector filter output 65 exceeds the threshold voltage V2 of Schmitt trigger 66, phase reversal control signal 67 becomes a logic "1" level and causes switch 76 to move to the "1" position shown as a dashed line in FIG. 3. In this instance, the inverted loop mixer signal 73 output from inverting amplifier 72 is now fed to loop low pass filter 54. The loop then continues to operate using inverted loop mixer signal 73 until such time as the phase of receiver output 37 changes sufficiently in the negative going direction to comprise a −180° phase shift, at which time the detector filter output signal 65 decreases below the voltage V1 threshold of Schmitt trigger 66. This changes the loop control signal 67 to a logic 0 level and thus causes switch 76 to return to the "0" position. The non-inverted loop mixer control signal 75 is now fed to loop low pass filter 54.

Most importantly, however, phase tracking circuit 50 operates so that phase reversal control signal 67 must be stabilized before any change occurs in the selected loop control signal 77 fed to loop filter 54. In other words, the time delay associated with phase reversal detector 60, including the detector mixer 62, detector low pass filter 64, and Schmitt trigger 66, is less than the time delay associated with slow loop filter 54. It is also desirable for changes in the VCO IN control signal 55 to occur more slowly than changes in the phase reversal control signal 67. Thus, the loop low pass filter 54 preferably has a time delay greater than the detector low pass filter 64. This insures that any changes due to the abrupt phase reversal of receiver output 37 are minimized at the VCO IN control signal 55. That is switch 76 has changed states before the slow loop filter 54 has changed its output voltage 55.

Figure 4:
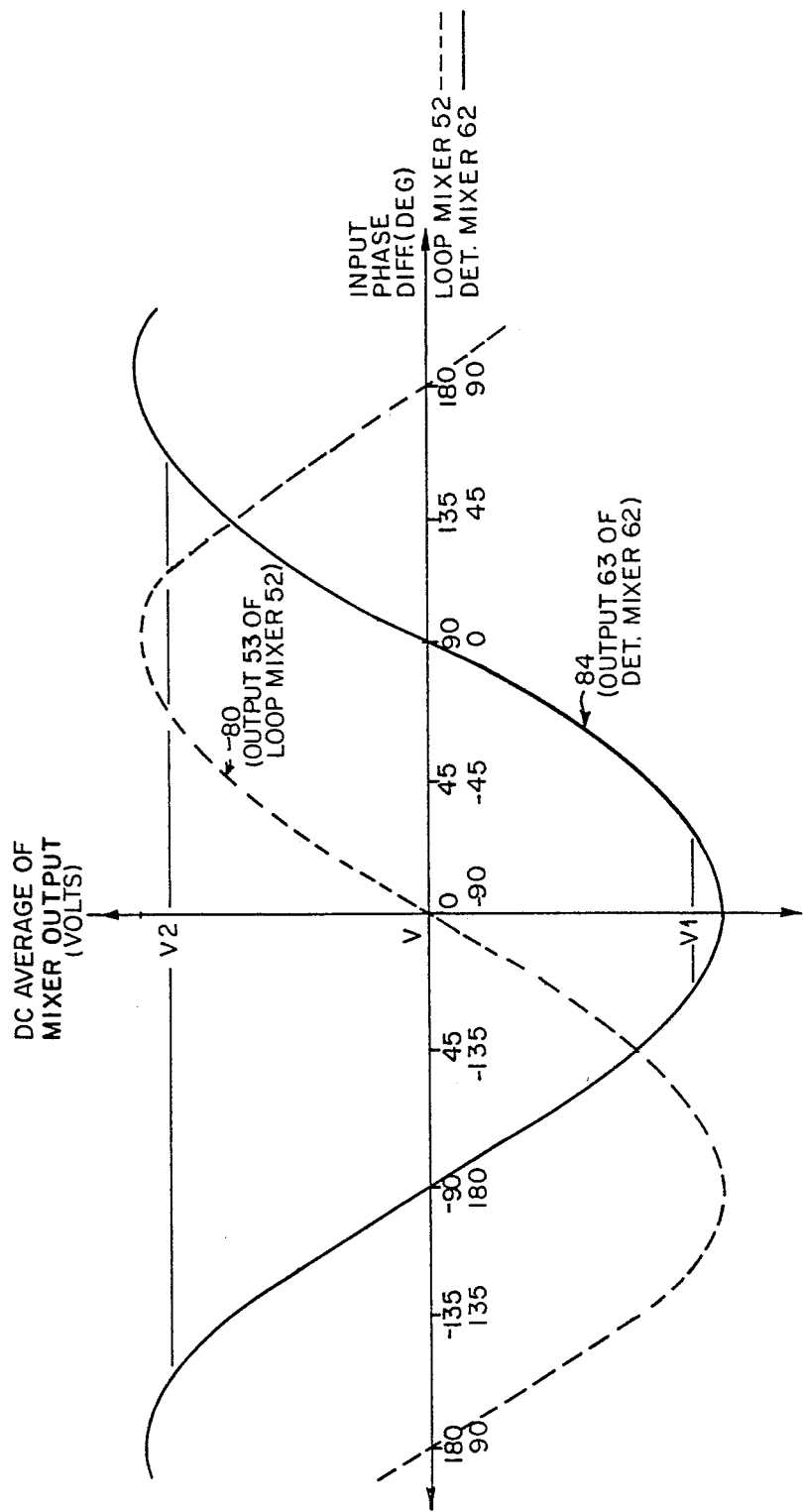
FIG. 4 shows the outputs of a detector mixer and loop mixer shown in FIG. 2 as a function of the phase difference between their input signals.

Further understanding of the operation of phase tracking circuit 50 can be understood by referring to FIG. 4. Shown are plots of the outputs of loop mixer 52 and detector mixer 62 versus the difference in phase between the signals fed to their respective inputs. In particular, a dashed curve 80 shows the loop mixer signal 53 output from loop mixer 52 as a function of the phase difference of its inputs, receiver output 37 and VCO 0° output 57b. The upper row of numerals along the abscissa are used for interpreting dashed curve 80. As seen in FIG. 3, this loop mixer signal 53 varies between a voltage greater than V2 and less than V1 about a mean voltage V. Output voltages V1 and V2 here are shown to correspond to points at input phases ±22.5° and ±157.5°, but it should be understood that other voltage thresholds for "maximum 0°" and "minimum 180°" may be used. The mean voltage V may or may not be zero volts. Thus, when the phase difference between the reference signal 36 and VCO 0° output signal 57b is 0°, loop mixer 52 provides an output of V volts. If the phase difference between these signals increases in magnitude, the loop mixer 52 output voltage also increases (or decreases) in magnitude to a maximum (or minimum) at a point where the input phase difference is 90° (or −90°).

The detector mixer output 63 from detector mixer 62 is shown in FIG. 4 as a solid curve 84. The lower row of numerals along the abscissa are used for interpreting solid curve 84. This solid curve 84 similarly varies between a maximum above V2 and a minimum below V1 about a mean V volts. Detector mixer output signal 63 has maximum negative and positive magnitude when the difference between its inputs, namely receiver output 37 and VCO 90° output 57a, is −90° or +90°, respectively.

Referring now to FIGS. 3 and 4 together it can be seen that when phase tracking circuit 50 is adjusted so that VCO 56 has its 0° output substantially phase aligned with the phase of receiver output 37, little or no change is needed in the VCO input to maintain the stability of the loop. Loop mixer output signal 53, via non-inverting amplifier 74 and switch 76 in the zero position, is then used directly by loop low pass filter 54 to control VCO 56. The switch 76 is held in the "0" position in this instance, as the detector mixer output 63 is well below the threshold voltage V2 at which it would change to a logic level 1. This situation corresponds to having the antenna 10 positioned so that the main lobe 16 of its antenna pattern 15 is intersecting bearing line 18. However, when an abrupt phase change of, say, 180° occurs, such as when the return signal 33 passes through a null 24 (FIG. 1C) of the antenna pattern 15, several things occur. The phase lock loop 50 (FIG. 3) is now unstable because the slope of the loop mixer output 80 (FIG. 4) is reversed at the 180° point of the horizontal axis. An ordinary phase lock loop (not shown) would correct this unstable loop condition by adjusting the phase through 180° in either direction back to the 0° point of the horizontal axis by changing the frequency of the VCO. As a result of this correction process, an ordinary phase lock loop would send false doppler information to the receiver 36 (FIG. 3), creating system loop instability, and, thus cause the loss of doppler tracking at the antenna null during the rapid doppler rolloff shown in FIG. 2. The improved phase lock loop 50 eliminates, or at least minimizes, the false doppler being sent to the receiver 36 without interruption of the doppler roll off information (as provided in phase tracking output 77) needed to maintain doppler tracking. Now, as the propagation delay through phase reversal detector 60 is less than the propagation delay through the VCO control loop (including slow loop filter 54), detector mixer 62 begins operating in a region such that its output voltage is greater than V2, as the difference between the 90° output of VCO 56 and the receiver output 37 is now approximately 180°. Thus, Schmitt trigger 66 provides a logic signal level 1 at its output, thereby causing switch 76 to move to the "1" position. This in turn has the effect of making the loop stable by inverting the loop mixer output signal 53, which by now is only a slight positive or negative voltage. Any change caused in the output of mixer 53 is filtered by loop low pass filter 54. Since the propagation delay of loop low pass filter 54 is greater than the propagation delay of phase reversal detector 60, however, this change is not present in the VCO control signal 55. As switch 76 has switched much more rapidly than any change in voltage fed back to VCO through loop filter 54, the VCO control signal 55 eventually fed to VCO 56 changes only by a small amount. When receiver output 37 makes an opposite change in phase (i.e., as return signal 18 (FIG. 1E) again passes through a null 25 as main lobe 16 fails to becomes realigned with moving object 12), the detector mixer output 63 again changes to a voltage more negative than V1, causing the Schmitt trigger 66 to provide a logic "0" level at phase reversal control signal 67. This in turn flips switch 76 back to the "0" position where the non-inverted loop mixer output 53 is then fed to slow loop low pass filter 54. Again, only a small disturbance will be fed forward to VCO 56.

It has thus been seen that the effect of adding a phase reversal detector circuit 60 and a phase reversing circuit 70 has been to eliminate the need for the phase tracking circuit 50 to seek a stable operating state after an abrupt 180° phase shift in the antenna output signal. This alleviates the problem caused by antenna 10 not being able to rotate quickly enough to remain aligned with moving object 12.

While what has been shown and described is considered to be the preferred embodiment of this invention, several modifications become readily apparent to those of skill in the art. In particular, various other arrangements may be used to obtain the same result. The fast low pass filter 64 might be eliminated, trading rejection of unwanted signals (ground clutter, other aircraft, etc.) during signal fade outs for further reduction of false Doppler during phase reversals. Additionally, the slow low pass filter 54 might be placed before amplifiers 72 and 74, directly after the loop mixer 52. Also, amplifiers 72 and 74, rather than being placed after loop mixer 52, might be placed at one of the inputs of loop mixer 52, either operating on receiver output 37 or on VCO 0° output signal 57b. It is possible to take the output 77 of phase tracking circuit 50 after the slow loop filter rather than before it. It is felt therefore, that this invention should not be restricted to the aforementioned embodiments but rather should be limited only by the scope and spirit of the following claims.

What is claimed is:
1. An improved phase locked loop comprising:
 (a) oscillator means for producing a reference signal having a phase which varies in response to a control input;
 (b) detection means, fed by an input signal and the reference signal, for providing an input reversal detection signal, such as input reversal detection signal having a first value when the phase of the input signal has reversed and a second value when the phase of the input signal has not reversed;
 (c) phase reversing means, coupled to said detection means fed by the input signal, for providing a stabilized signal, the stabilized signal having a magnitude substantially proportional to the difference between the phase of the input signal and the phase of the reference signal when said detection means indicates the phase of the input signal has not reversed and substantially proportional to the opposite of the difference between the phase of the input signal and the phase of the reference signal when said detection means indicates the phase of the input signal has reversed, said phase reversing means comprising switching means, responsive to the input reversal detection signal, for deriving the stabilized signal from a first circuit when the input reversal detection signal has the first value and deriving the stabilized signal from a second circuit when the input reversal detection signal has the second value; and (d) means, coupled to said phase reversal means, for providing the control input of the oscillator means.

2. The improved phase locked loop as in claim 1 wherein said detection means comprises:

(a) detector mixing means, fed by the input signal and the reference signal, for providing a detector mixing means output signal indicative of the phase difference between the input signal and the reference signal; and (b) threshold means, coupled to said detector mixing means, for providing the input reversal detection signal.

3. The improved phase locked loop as in claim 2 wherein:

(a) the means for providing the control input of the oscillator means comprises a first low pass filter having a first cutoff frequency; and (b) the threshold means is coupled to the detector means through a second low pass filter having a second cutoff frequency higher than the first cutoff frequency.

4. An improved radar system for producing a Doppler signal from reflections of a radar signal from a moving object, comprising:

(a) a directional antenna having an antenna pattern with main lobe portions and null portions, the antenna also having a radio frequency output signal;

(b) first detection means, fed by the radio frequency output, for determining if the moving object has moved so as to cause a null portion of the antenna pattern to align with the moving object; second detection means, responsive to the directional antenna, for producing a phase signal indicative of the phase between the radio frequency output signal and a reference signal; and (c) phase reversing means, fed by said second detection means, for producing the Doppler signal equal to phase signal with reversed polarity when said first detection means does not determines that the moving object has not aligned with a null portion of the antenna pattern. portion of the antenna pattern.

5. Apparatus for providing a reference signal remaining constant despite phase reversals in an input signal, comprising:

loop mixer means, fed by the input signal and the reference signal, and having a propagation delay for providing a loop deviation signal indicating the phase difference between the input and reference signals;

inverting amplifier means, fed by the loop deviation signal and having a propagation delay, for providing an inverted loop control signal;

non-inverting amplifier means, fed by the loop deviation signal and having a propagation delay, for providing a non-inverted loop control signal;

phase shifting means, fed by the reference signal and having a propagation delay, for providing a shifted reference signal substantially ninety degrees out of phase with the reference signal;

reversal detecting means, fed by the input signal and the shifted reference signal and having a propagation delay, for providing an input phase reversal detect signal;

Schmitt trigger means, fed by the input phase reversal detect signal and having a propagation delay, for providing a digital loop reversal control signal having a first logical value when said reversal detecting means indicates the phase of the input signal is substantially aligned with the reference signal and the digital loop reversal control signal having a second logical value when said reversal detecting means indicates the phase of the input signal is substantially different from the phase of the reference signal;

switch means, fed by the non-inverted loop control signal, the inverted loop control signal and the digital loop reversal control signal and having a propagation delay, for providing a selected loop control signal, the selected loop control signal proportional to the non-inverted loop control signal when the loop reversal control signal has the first logical value and the selected loop control signal proportional to the inverted loop control signal when the loop reversal signal has the second logical value;

loop filter means, fed by the selected loop control signal and having a propagation delay, for outputting an oscillator control signal, the propagation delay of said loop filter such that the sum of the propagation delays of said reversal detecting means and said Schmitt trigger means is less than the sum of the propagation delay of said loop mixer means, said switch means, said loop filter means and the slower of said inverting amplifier means and said non-inverting amplifier means; and oscillator means, fed by said oscillator control signal, for providing the reference signal.

6. A method for tracking deviations in phase of an input signal despite phase reversals in the input signal, comprising:

(a) comparing the phase of a reference signal and the input signal to indicate if a phase reversal in the input signal has occurred;

(b) providing a phase signal by determining the difference between the phase of the input signal and the phase of the reference signal;

(c) forming an inverted phase signal by inverting the phase signal;

(d) selecting as a control signal the inverted phase signal when a phase reversal has occurred and selecting as the control signal the phase signal when a phase reversal has not occurred; and (e) changing the phase of the reference signal in proportion to the value of the control signal.

7. An apparatus comprising:

(a) Oscillator means for producing a reference signal which varies in phase in response to a control input;

(b) phase detector means, fed by an input signal and the reference signal, for indicating if an abrupt phase change has occurred in the input signal, and for producing a phase signal indicating the difference in phase between the input signal and the reference signal;

(c) inverting means, fed by the phase detector means, for inverting the phase signal; and (d) means for coupling the phase signal to the control input of the oscillator means when the phase detector indicates an abrupt phase change has not occurred and for coupling the inverted phase signal to the control input of the oscillator means when the phase detector indicates an abrupt phase change has occurred.

* * * * *

UNITED STATES PATENT AND TRADEMARK OFFICE
CERTIFICATE OF CORRECTION

PATENT NO. : 4,806,934
DATED : February 21, 1989
INVENTOR(S) : John E. Magoon

It is certified that error appears in the above-identified patent and that said Letters Patent is hereby corrected as shown below:

Title page:

Change the Assignee from "Ray Theon Company" to --Raytheon Company--.

Insert after the Assistant Examiner line, the following line: --Attorney, Agent, or Firm - Richard M. Sharkansky Edmund J. Walsh--.

Column 4, Line 22, change "t1 and t2" to --$t_1$ and $t_2$--.

Claim 4, Line 41, change "determines" to --determine--.

Claim 4, Line 43, after "of the antenna pattern.", delete "portion of the antenna pattern."

Signed and Sealed this

Fifth Day of September, 1989

Attest:

DONALD J. QUIGG

Attesting Officer

Commissioner of Patents and Trademarks